(12) United States Patent  
Luo et al.

(10) Patent No.: US 7,666,790 B2
(45) Date of Patent: Feb. 23, 2010

(54) SILICIDE GATE FIELD EFFECT TRANSISTORS AND METHODS FOR FABRICATION THEREOF

(75) Inventors: Zhijiong Luo, Carmel, NY (US); William K. Henson, Peekskill, NY (US); Christian Lavoie, Ossining, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 221 days.

(21) Appl. No.: 11/380,528

(22) Filed: Apr. 27, 2006

(65) Prior Publication Data

US 2007/0254478 A1 Nov. 1, 2007

(51) Int. Cl.
*H01L 21/44* (2006.01)
(52) U.S. Cl. .................. 438/682; 438/661; 438/664; 257/E21.475; 257/E21.596; 257/E21.592
(58) Field of Classification Search .................. 438/682, 438/661, 662, 663, 664; 257/E21.496, E21.497, 257/E21.593, E21.592, E21.596, E21.475
See application file for complete search history.

(56) References Cited

U.S. PATENT DOCUMENTS

| 6,187,617 | B1 * | 2/2001 | Gauthier et al. | 438/197 |
|---|---|---|---|---|
| 6,329,256 | B1 * | 12/2001 | Ibok | 438/299 |
| 6,514,859 | B1 * | 2/2003 | Erhardt et al. | 438/664 |
| 6,555,453 | B1 | 4/2003 | Xiang et al. | |
| 6,562,718 | B1 * | 5/2003 | Xiang et al. | 438/682 |
| 7,005,716 | B2 * | 2/2006 | Lin et al. | 257/407 |
| 7,015,126 | B2 * | 3/2006 | Wu et al. | 438/592 |
| 2004/0207023 | A1 * | 10/2004 | Nishiyama et al. | 257/371 |
| 2005/0070062 | A1 * | 3/2005 | Visokay et al. | 438/236 |
| 2005/0106788 | A1 | 5/2005 | Amos et al. | |
| 2005/0136605 | A1 * | 6/2005 | Murto et al. | 438/303 |
| 2005/0167766 | A1 * | 8/2005 | Yagishita | 257/410 |
| 2005/0263824 | A1 * | 12/2005 | Nakajima | 257/369 |
| 2006/0105515 | A1 * | 5/2006 | Amos et al. | 438/199 |
| 2007/0166937 | A1 * | 7/2007 | Adetutu et al. | 438/300 |

* cited by examiner

*Primary Examiner*—Caridad M Everhart
(74) *Attorney, Agent, or Firm*—Scully, Scott, Murphy & Presser, P.C.; H. Daniel Schnurmann

(57) ABSTRACT

A method for fabricating a silicide gate field effect transistor includes masking a silicon source/drain region prior to forming the silicide gate by annealing a metal silicide forming metal layer contacting a silicon-containing gate. The silicide gate may be either a fully silicided gate or a partially silicided gate. After unmasking the source/drain region a silicide layer may be formed upon the source/drain region, and also upon the partially silicided gate. The second silicide layer and the partially silicided gate also provide a fully silicided gate.

7 Claims, 7 Drawing Sheets

SILICIDE GATE FIELD EFFECT TRANSISTORS AND METHODS FOR FABRICATION THEREOF

BACKGROUND

1. Field of the Invention

The invention relates generally to semiconductor structures and methods of fabricating the same. More particularly, the invention relates to field effect transistors (FETs) including silicided gates and methods of fabricating the same.

2. Description of the Related Art

A recent trend in field effect transistor technology has been the replacement of polysilicon gates with alternative gate materials that are not susceptible to a charge carrier depletion effect. A charge carrier depletion effect results when a polysilicon gate is energized and charge carriers are depleted at the polysilicon gate to gate dielectric interface. Charge carrier depletion effects can often significantly compromise field effect transistor operating characteristics, since charge carrier depletion effects provide for a greater effective gate dielectric thickness than an actual gate dielectric thickness.

Alternatives to polysilicon gate materials are typically metal gate materials or silicide gate materials. Neither metal gate materials, nor silicide gate materials, are susceptible to a charge carrier depletion effect. Therefore, both are promising candidates to replace polysilicon gate materials.

There are existing methods for fabricating fully silicided gates. For example, Xiang et al., in U.S. Pat. No. 6,562,718, teaches a method for forming a silicide gate within a field effect transistor. This prior art method forms the silicidization of silicided source/drain regions first, and following that uses a blocking layer to avoid additional silicidization of silicided source/drain regions when forming a fully silicided gate. In addition, Amos et al., in U.S. Pub. No. 2005/0106788 teaches a method for fabricating multiple threshold metal gates within CMOS structures. This prior art method uses different silicide materials to provide the multiple threshold metal gates.

Since a trend for decreased dimensions of field effect transistors is certain to continue, and since silicide gate field effect transistors (i.e., fully silicided gate field effect transistors) provide enhanced performance, additional silicide gate field effect transistor structures and methods for fabrication thereof are desirable.

SUMMARY OF THE INVENTION

The invention provides silicide gate field effect transistor structures and methods for fabrication thereof.

The methods comprise self aligned silicide (i.e., salicide) methods that yield field effect transistor structures that have different silicide materials or different silicide materials compositions within a fully silicided gate in comparison with a silicide layer located upon a source/drain region. The gate and source/drain silicide materials can be the same, but the specifics of composition may be different due to different process conditions, such as temperature.

One field effect transistor structure in accordance with the invention includes a fully silicided gate comprising a second silicide material comprising a second silicide forming metal located upon a first silicide material comprising a first silicide forming metal that is different from the second silicide forming metal. Within this structure, the fully silicided gate is located over a semiconductor substrate. This particular field effect transistor structure also includes a source/drain region located within the semiconductor substrate and adjoining a channel region beneath the fully silicided gate. This particular field effect transistor structure also includes a silicide layer located upon the source/drain region, where the silicide layer comprises the second silicide forming metal, but not the first silicide forming metal.

A method for fabricating a semiconductor structure in accordance with the invention includes forming a silicon-containing gate over a semiconductor substrate and forming a source/drain region into the semiconductor substrate while using the silicon-containing gate as a mask. This particular method also includes masking the source/drain region, without a silicide layer located thereupon, with a mask that exposes the silicon-containing gate. This particular method also includes forming a metal silicide forming metal layer contacting the silicon-containing gate. Finally, this particular method also includes annealing the metal silicide forming metal layer in contact with the silicon-containing gate to form a silicide gate.

Another method for fabricating a semiconductor structure in accordance with the invention includes forming a silicon-containing gate over a semiconductor substrate and forming a source/drain region into the semiconductor substrate while using the silicon-containing gate as a mask. This other method also includes masking the source/drain region, without a silicide layer located thereupon, with a mask that exposes the silicon-containing gate. This other method also includes forming a metal silicide forming metal layer contacting the silicon-containing gate. This other method also includes opto-thermally annealing the metal silicide forming metal layer in contact with the silicon-containing gate to form a silicide gate.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENTS

The invention, which provides silicide gate field effect transistors and methods for fabrication thereof, will be described in further detail within the context of further description below. The description below is understood within the context of the drawings described above. Since the drawings are for illustrative purposes only, they are not necessarily drawn to scale.

Figure 1:
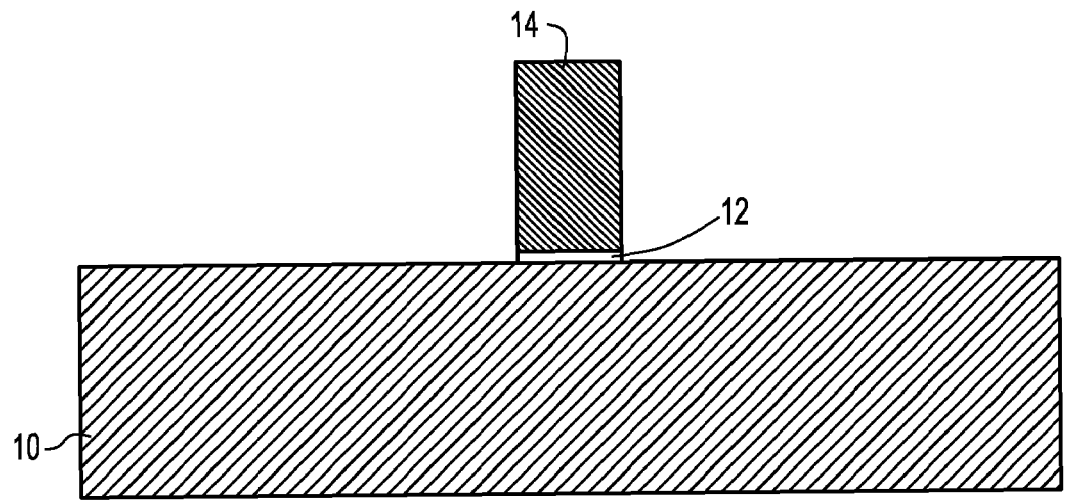
FIG. 1 to FIG. 14 show a series of schematic cross-sectional diagrams illustrating the results of progressive stages in fabricating silicide gate field effect transistors in accordance with preferred embodiments of the invention.

FIG. 1 to FIG. 14 show a series of schematic cross-sectional diagrams illustrating the results of progressive stages in fabricating silicide gate field effect transistors in accordance with preferred embodiments of the invention. FIG. 1 shows a schematic cross-sectional diagram of a field effect transistor at an early stage in its fabrication in accordance with the preferred embodiments.

Specifically, FIG. 1 shows a semiconductor substrate 10 having a patterned gate stack comprising, from bottom to top, a gate dielectric 12 and an overlying silicon-containing gate 14.

The semiconductor substrate 10, gate dielectric 12 and silicon-containing gate 14 that are illustrated in FIG. 1 may comprise materials, have dimensions and be formed using methods that are conventional in the semiconductor fabrication art.

The semiconductor substrate 10 may comprise semiconductor materials including, but not limited to: silicon, germanium, silicon-germanium alloy, silicon carbide, silicon-germanium carbide alloy and compound (i.e., III-V or II-VI) semiconductor materials. Non limiting examples of compound semiconductor materials include gallium arsenide, indium arsenide and indium phosphide semiconductor materials.

The semiconductor substrate 10 may comprise a bulk semiconductor substrate, or in the alternative, the semiconductor substrate 10 may comprise a semiconductor-on-insulator substrate. A semiconductor-on-insulator substrate comprises a base semiconductor substrate, a buried dielectric layer located thereupon and a surface semiconductor substrate located further thereupon. Semiconductor-on-insulator substrates may be formed using methods including, but not limited to: layer transfer methods, laminating methods and separation by implantation of oxygen (SIMOX) methods. The semiconductor substrate 10 may further also comprise a hybrid orientation (HOT) substrate. A hybrid orientation substrate comprises a plurality of semiconductor regions having different crystallographic orientations.

The gate dielectric 12 may comprise generally conventional gate dielectric materials such as oxides, nitrides and oxynitrides of silicon having a dielectric constant from about 4 to about 20, measured in a vacuum. Multilayered stacks of such gate dielectric materials are also contemplated herein. Alternatively, the gate dielectric 12 may comprise generally higher dielectric constant gate dielectric materials having a dielectric constant from about 20 to at least about 100. Non-limiting examples of these generally higher dielectric constant gate dielectric materials include hafnium oxides, hafnium silicates, titanium oxides, lanthanum oxides, barium-strontium titantates (BSTs) and lead-zirconate titanates (PZTs).

The gate dielectric 12 may be formed using any of several methods that are appropriate to materials of composition of the gate dielectric 12. Non-limiting examples include thermal or plasma oxidation or nitridation methods, chemical vapor deposition methods (including atomic layer chemical vapor deposition methods) and physical vapor deposition methods (including sputtering methods). Typically, the gate dielectric 12 comprises a thermal silicon oxide gate dielectric material having a thickness from about 5 to about 70 angstroms.

The silicon-containing gate 14 comprises a silicon-containing material. The term "silicon containing" is used herein to denote Si and/or SiGe materials. Non-limiting examples of silicon-containing materials include amorphous silicon-containing materials and polysilicon-containing materials. Polysilicon-containing materials, especially polySi, are more common. The silicon-containing material may be deposited using methods including, but not limited to: chemical vapor deposition methods (including thermal chemical vapor deposition methods, plasma enhanced chemical vapor deposition methods and atomic layer chemical vapor deposition methods) and physical vapor deposition methods. Typically the silicon-containing gate 14 comprises a polysilicon material having a thickness from about 500 to about 1500 angstroms.

Figure 2:
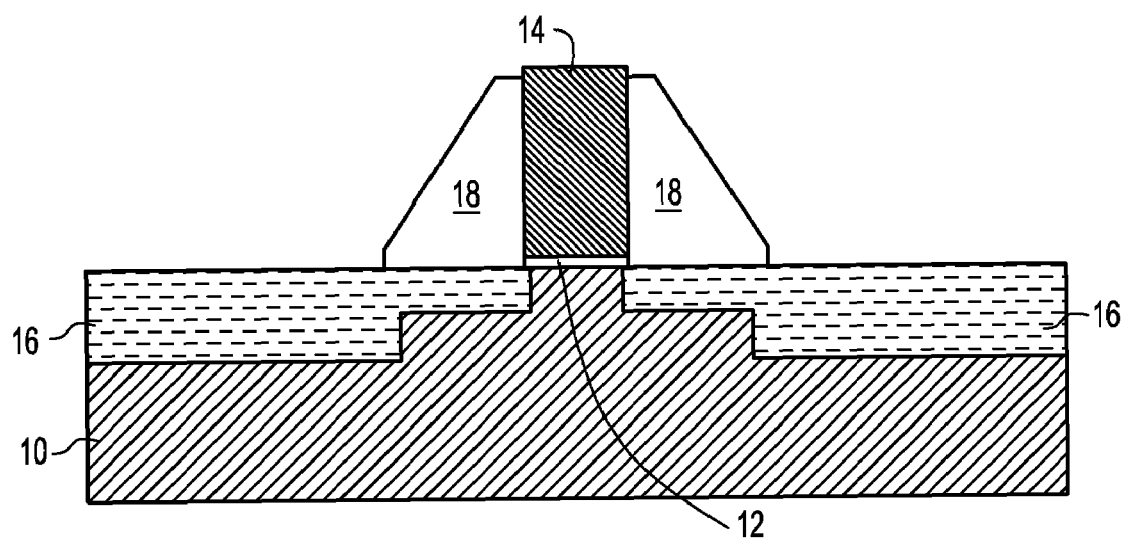

FIG. 2 shows source/drain regions 16 located within the semiconductor substrate 10 and separated by a channel region that is located beneath the silicon-containing gate 14. FIG. 2 also shows a spacer 18 that adjoins the silicon gate 14. Although the spacer 18 is illustrated as two component pieces in cross-section, the spacer 18 in plan-view is actually one component that peripherally surrounds the silicon-containing gate 14.

The spacer 18 may comprise a dielectric spacer material or a conductor spacer material, although a dielectric spacer material is considerably more common. Non-limiting examples of dielectric spacer materials include oxides, nitrides and oxynitrides of silicon. Oxides, nitrides and oxynitrides of other elements are not excluded. The spacer 18 is formed using a blanket spacer material layer deposition and anisotropic etchback method. The blanket spacer material layer may be deposited using methods including, but not limited to: chemical vapor deposition methods (including low pressure thermal chemical vapor deposition methods and plasma enhanced chemical vapor deposition methods) and physical vapor deposition methods. Typically, the spacer 18 comprises a silicon nitride and/or oxide material or a laminate of dielectric materials that includes a silicon oxide material.

The source/drain regions 16 comprise a dopant having a polarity (i.e., conductivity type n or p) appropriate to a polarity of a silicide gate field effect transistor desired to be fabricated. The dopant is of a polarity other than the semiconductor substrate 10. The source/drain regions 16 are formed using a two step ion implantation method. A first step within the two step ion implantation method uses the silicon-containing gate 14 and sub-portion of the first part of spacer 18 as a mask and forms a pair of extension regions into the semiconductor substrate 10. A second step within the two step ion implantation method uses the silicon-containing gate 14 and the complete spacer 18 as a mask to form a pair of contact region portions of the pair of source/drain regions 16. The contact region portions of the source/drain regions 16 incorporate the pair of extension regions that extend underneath the spacer 18. Dopant concentrations within the source/drain regions 16 typically range from about 1e15 to about 1e22 dopant atoms per cubic centimeter. Dopant concentrations within the semiconductor substrate 10 typically range from about 1e12 to about 1e18 dopant atoms per cubic centimeter.

Figure 3:
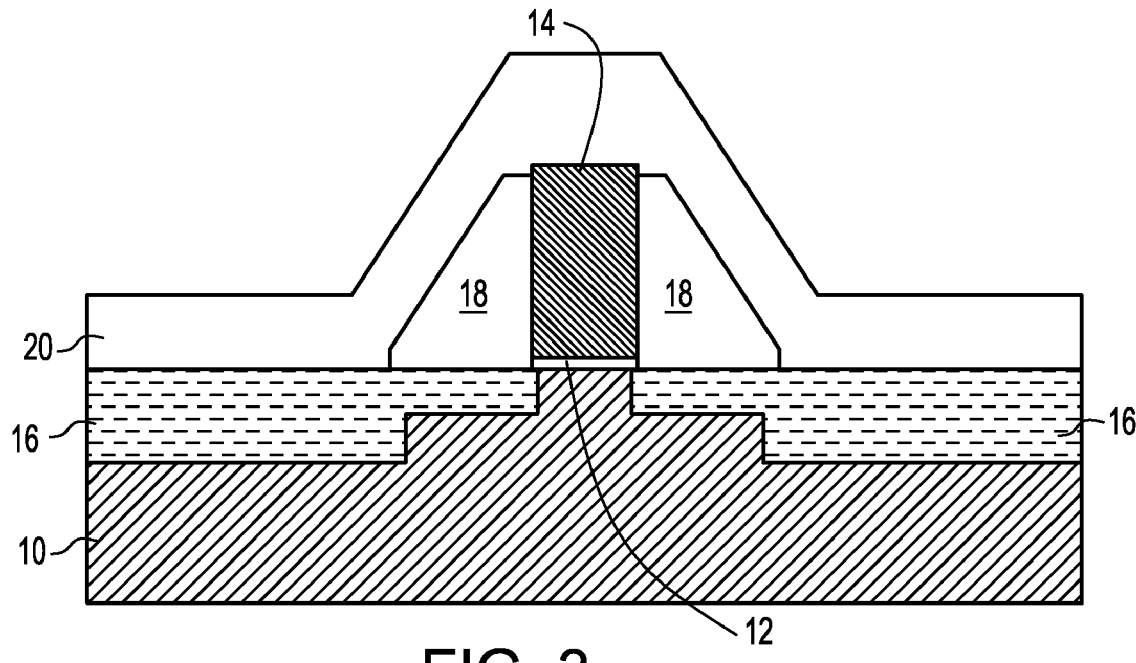

FIG. 3 shows a capping layer 20 located upon the semiconductor structure whose schematic cross-sectional diagram is illustrated in FIG. 2.

The capping layer 20 may comprise any of several capping materials, provided that a capping material used for the capping layer 20 may be subsequently etched and removed from the semiconductor structure whose schematic cross-sectional diagram is illustrated in FIG. 2 selectively with respect to other structures within the semiconductor structure whose schematic cross-sectional diagram is illustrated in FIG. 2. Thus, selection of a material of composition for the capping layer 20 is undertaken within the context of selection of materials for other layers and structures that are illustrated in FIG. 2. In particular, when the spacer 18 comprises a silicon nitride material, the capping layer 20 preferably comprises a silicon oxide material or a silicon oxynitride material. The capping layer 20 may be formed using any of the several methods disclosed above for forming a blanket layer which is anisotropically etched to form the spacer 18. Typically, the capping layer 20 comprises a silicon nitride or silicon oxynitride material that has a thickness from about 50 to about 500 angstroms.

Figure 4:
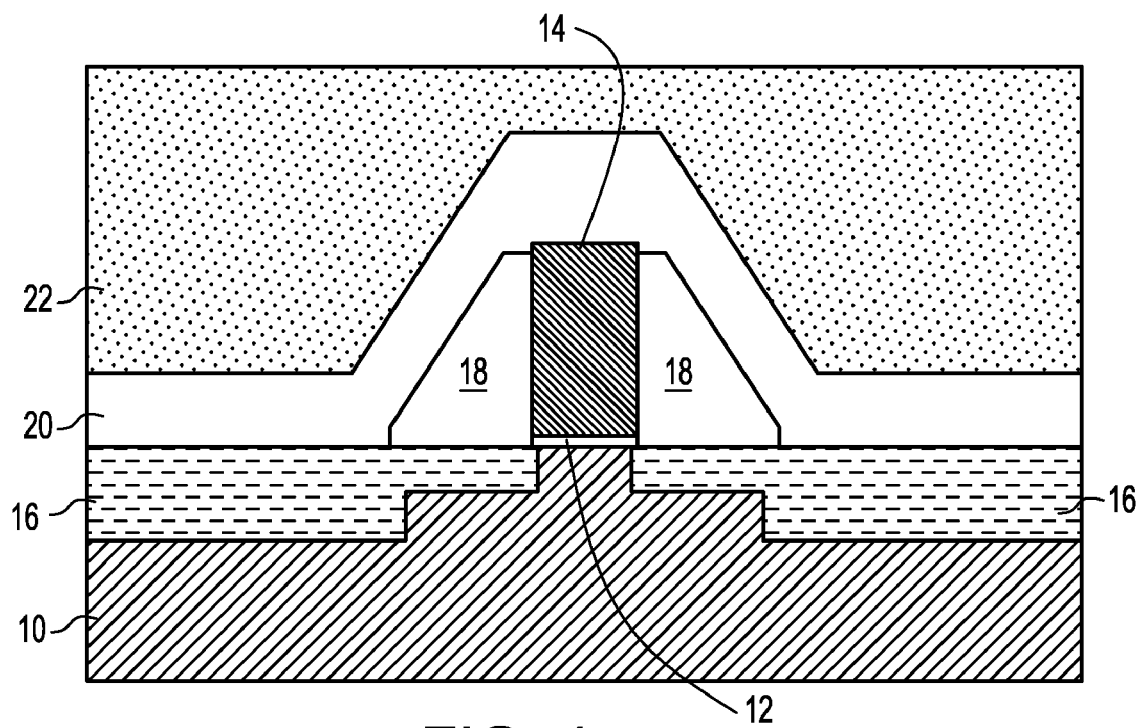

FIG. 4 shows a planarizing layer 22 located upon the capping layer 20. The planarizing layer 22 may comprise any of several planarizing materials. Included are organic polymer planarizing materials and spin-on-glass planarizing materials. More common are organic polymer planarizing materials that include organic polymers as well as photoresist materials. The planarizing layer 22 may be deposited using methods including, but not limited to: spin coating methods and chemical vapor deposition methods. Typically, the planarizing layer 22 comprises an organic polymer planarizing material that has a thickness that fully covers that capping layer 20, and provides a thickness of the planarizing layer 22 above the silicon-containing gate 14 from about 50 to about 500 angstroms.

Figure 5:
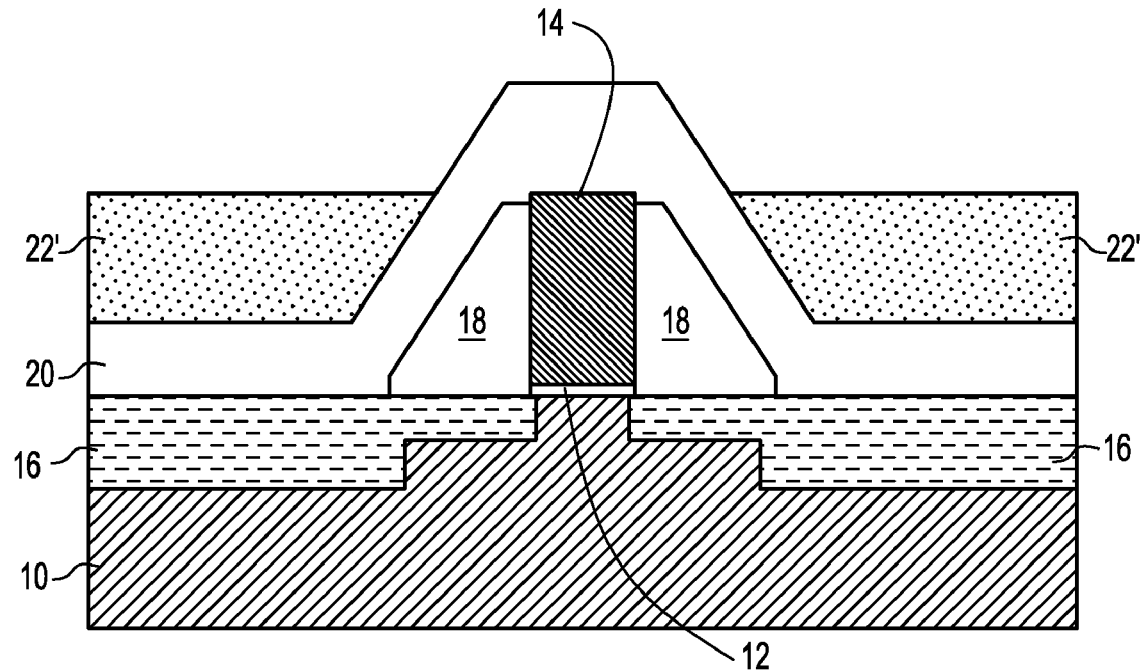

FIG. 5 shows the results of etching back the planarizing layer 22 to yield a patterned planarizing layer 22'. The planarizing layer 22 is typically etched back to provide the patterned planarizing layer 22' while using an anisotropic etch method; although an isotropic etch method may also effectively etch back the planarizing layer 22 to form the patterned planarizing layer 22'. The planarizing layer 22 may be etched back using plasma etching methods (that may be either anisotropic or isotropic) or wet chemical etching methods (that are typically isotropic etching methods). Oxygen plasma etching methods are particularly common when the planarizing layer comprises an organic polymer material or a photoresist material. The planarizing layer 22 is etched back to form the patterned planarizing layer 22' so that the patterned planarizing layer 22' leaves exposed a portion of the capping layer 20 over the silicon-containing gate 14. Typically from about 300 to about 600 angstroms of the thickness of the planarizing layer 22 is etched back when forming the patterned planarizing layer 22'.

Figure 6:
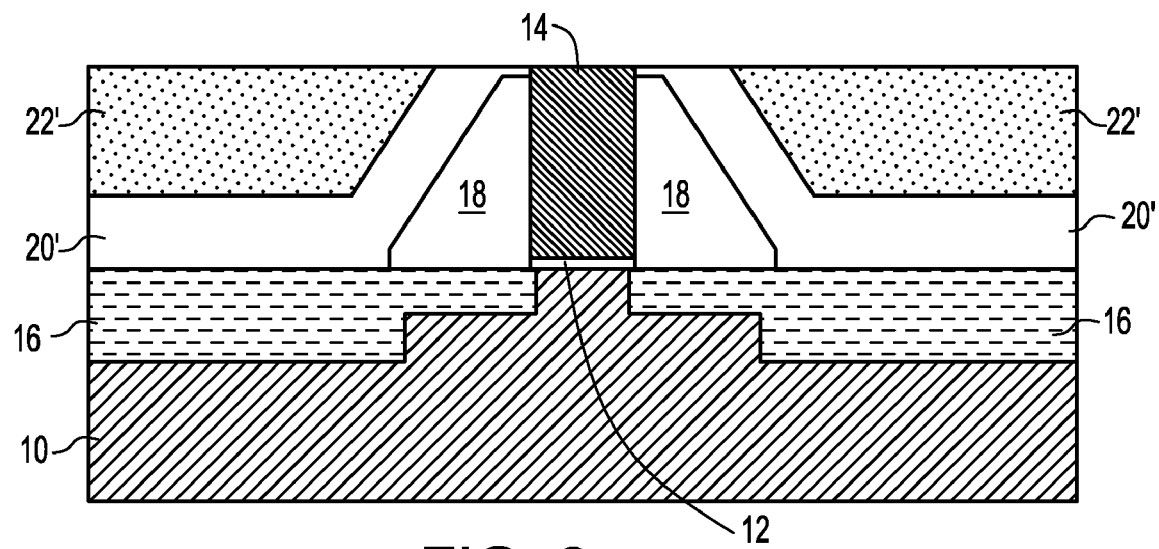

FIG. 6 shows the results of etching and stripping the portion of the capping layer 20 located over and covering the silicon-containing gate 14 to form a patterned capping layer 20' that exposes a top portion of the silicon-containing gate 14. The foregoing etching and stripping may be effected using methods and materials that are appropriate to the material of composition of the capping layer 20. Wet chemical etching methods, dry plasma etching methods and aggregate etching methods thereof may be used. When the capping layer 20 comprises a silicon nitride material, the capping layer 20 may be etched and patterned to form the patterned capping layer 20' while using an aqueous phosphoric acid etchant at an elevated temperature from about 80° to about 100° C. Alternative methods and materials may also be used.

Figure 7:
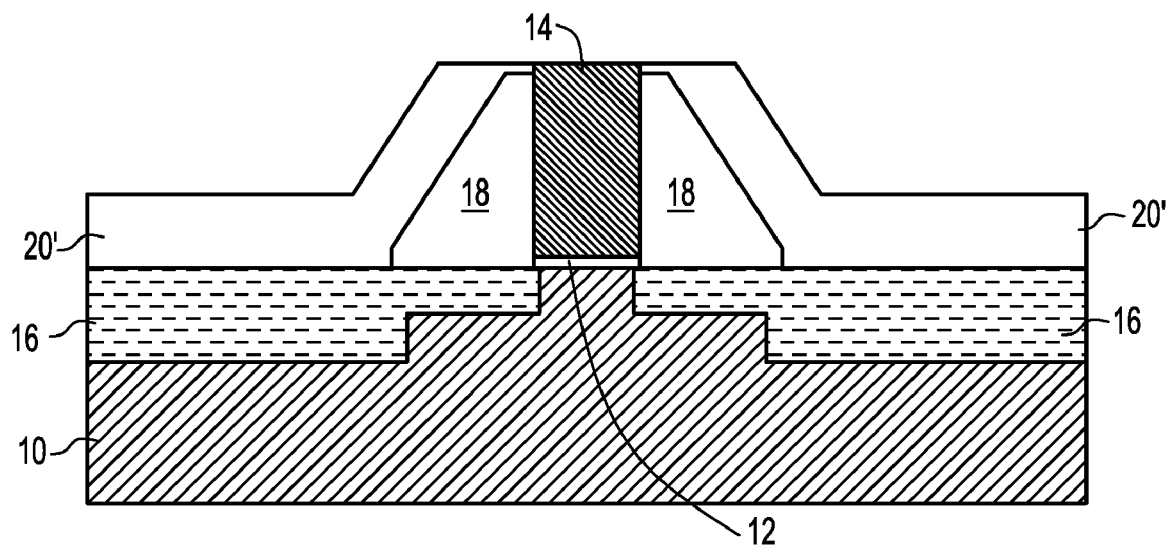

FIG. 7 shows the results of stripping the patterned planarizing layer 22' from the semiconductor structure whose schematic cross-sectional diagram is illustrated in FIG. 6. The patterned planarizing layer 22' may be stripped using methods and materials that are otherwise generally conventional in the semiconductor fabrication art. Non-limiting examples include wet chemical stripping methods, dry plasma stripping methods and aggregate stripping methods thereof. When the planarizing layer 20 comprises an organic polymer planarizing material, the patterned planarizing layer 20' is preferably stripped using a wet chemical stripping method that uses an organic solvent followed by a mild (i.e., less than about 10 watts per square centimeter surface area) dry plasma stripping method that uses an oxygen plasma. The mild dry plasma stripping method is used since it is undesirable within the embodiments and the invention to expose the silicon-containing gate 14 to strongly oxidizing atmospheres that might form a thick (i.e., greater than about 50 angstroms) silicon oxide layer thereupon. Alternatively, if such a silicon oxide layer is formed, it may be stripped using a hydrofluoric acid etchant.

Figure 8:
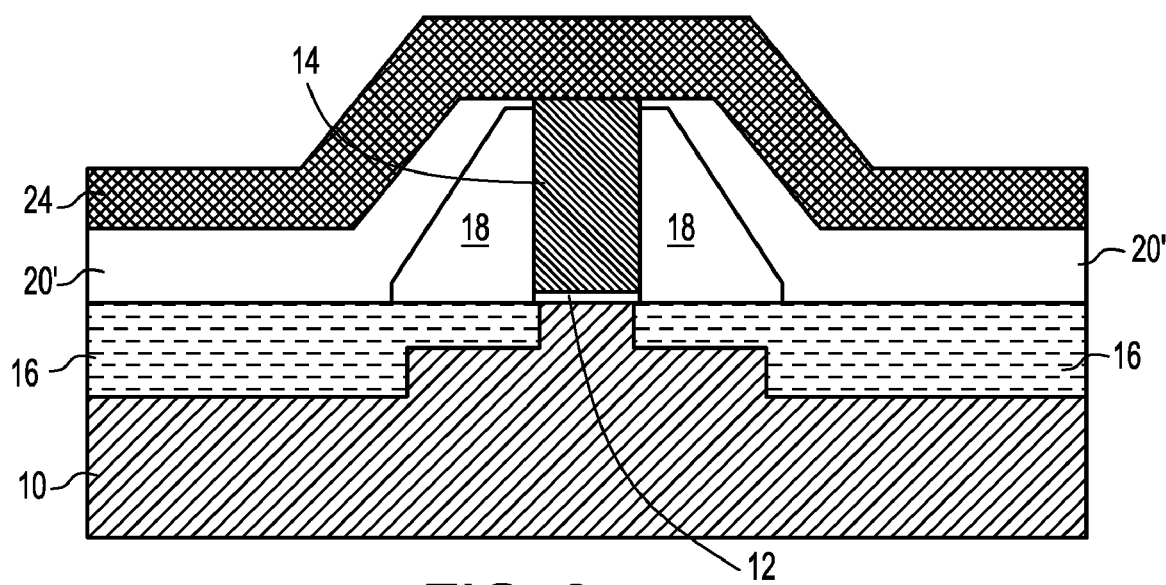

FIG. 8 shows a metal silicide forming metal layer 24 located upon the semiconductor structure of FIG. 7, and in particular contacting the silicon-containing gate 14. The metal silicide forming metal layer 24 is masked and blocked from contacting the pair of source/drain regions 16 by the presence of the patterned capping layer 20'. The metal silicide forming metal layer 24 may comprise any of several metal silicide forming metals. Non-limiting examples include cobalt, nickel, platinum, titanium, tungsten and vanadium, although cobalt and nickel are particularly common and desirable metal silicide forming metals. The metal silicide forming metal layer 24 may be formed using any of several deposition methods. Non-limiting examples include chemical vapor deposition methods and physical vapor deposition methods. Physical vapor deposition methods which include, but are not limited to: evaporation methods and sputtering methods, are particularly common. Typically, the metal silicide forming metal layer 24 may have a thickness so that the silicon-containing gate 14 is completely consumed when the silicon-containing gate 14 is annealed in contact with the metal silicide forming metal layer 24. Typically, the metal silicide forming metal layer 24 has a thickness from about 500 to about 1000 angstroms.

Figure 9:
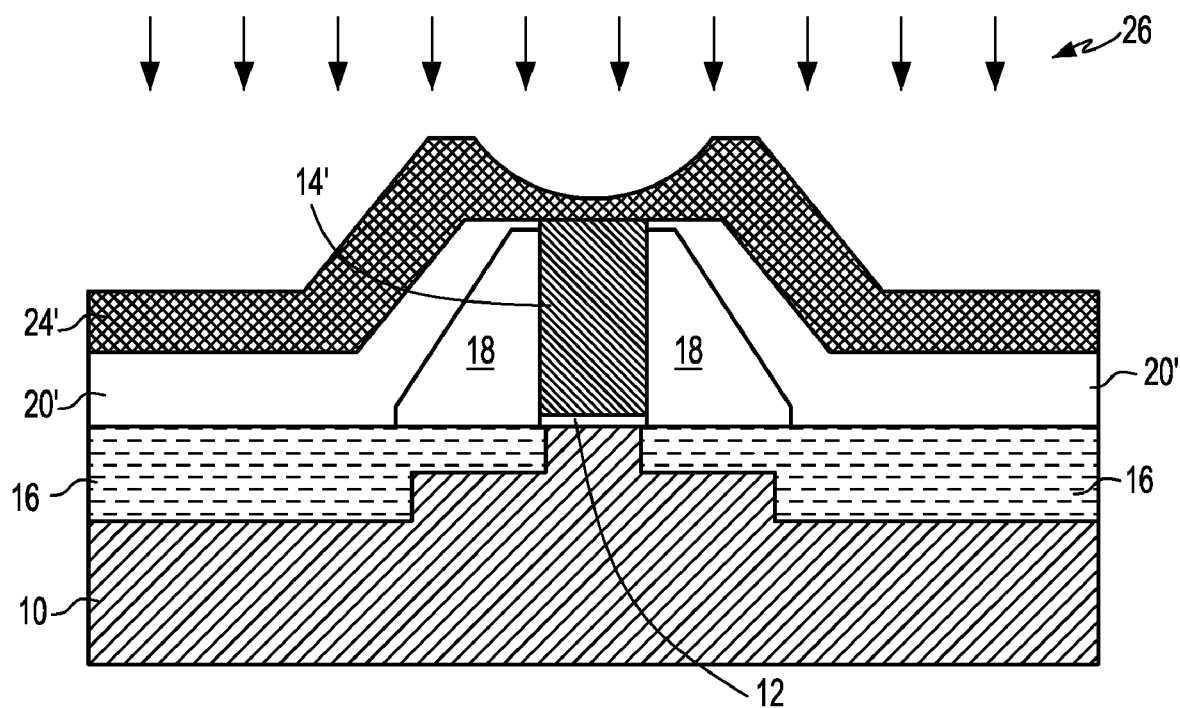

FIG. 9 shows the results annealing the metal silicide forming metal layer 24 in contact with the silicon-containing gate 16 to form a partially consumed metal silicide forming metal layer 24' and a partially silicided gate 14'. Within the embodiment and the invention, the annealing uses a rapid thermal annealing 26 treatment. The rapid thermal annealing 26 treatment uses an annealing timescale from about 1 to about 200 milliseconds and an annealing temperature from about 800° to about 1400° C. Typical rapid thermal annealing 26 treatments (i.e., opto-thermal treatments) include flash annealing treatments and spike annealing treatments that use high intensity optical lamp illumination. The optical lamp illumination typically uses white light illumination, although the method is not so limited. Also included as a rapid thermal annealing 26 treatment is a laser annealing treatment that uses high intensity laser radiation. The laser radiation may range from about 400 to about 10000 nm, with laser radiation at 880 nm being particularly common.

Thus, within the embodiments thermal annealing of the silicon-containing gate 14 in the presence of the metal silicide forming metal layer 24 is effected using optical radiation sources. The invention is not, however, so limited. Other thermal annealing sources may be used. Such a comparatively short thermal exposure timescale from about 1 to about 200 milliseconds (and preferably from about 1 to about 100 milliseconds) provides for an optically induced thermal annealing of the metal silicide forming metal layer 24 and the silicon-containing gate 14 without appreciable thermal annealing and exposure of the source/drain regions 16. Thus, in comparison with more conventional alternative thermal annealing methods that use a longer thermal exposure timescale, such as furnace annealing methods, the invention provides for shorter thermal exposure timescales that provide for enhanced stability of dopant junctions and much less dopant diffusion, in particular with respect to the source/drain regions 16. More important, the material composition of silicide formed using these rapid anneal method at relative high temperatures is different from the materials composition of silicide formed using more conventional alternative thermal annealing methods that use a longer thermal exposure timescale, such as furnace annealing methods.

Figure 10:
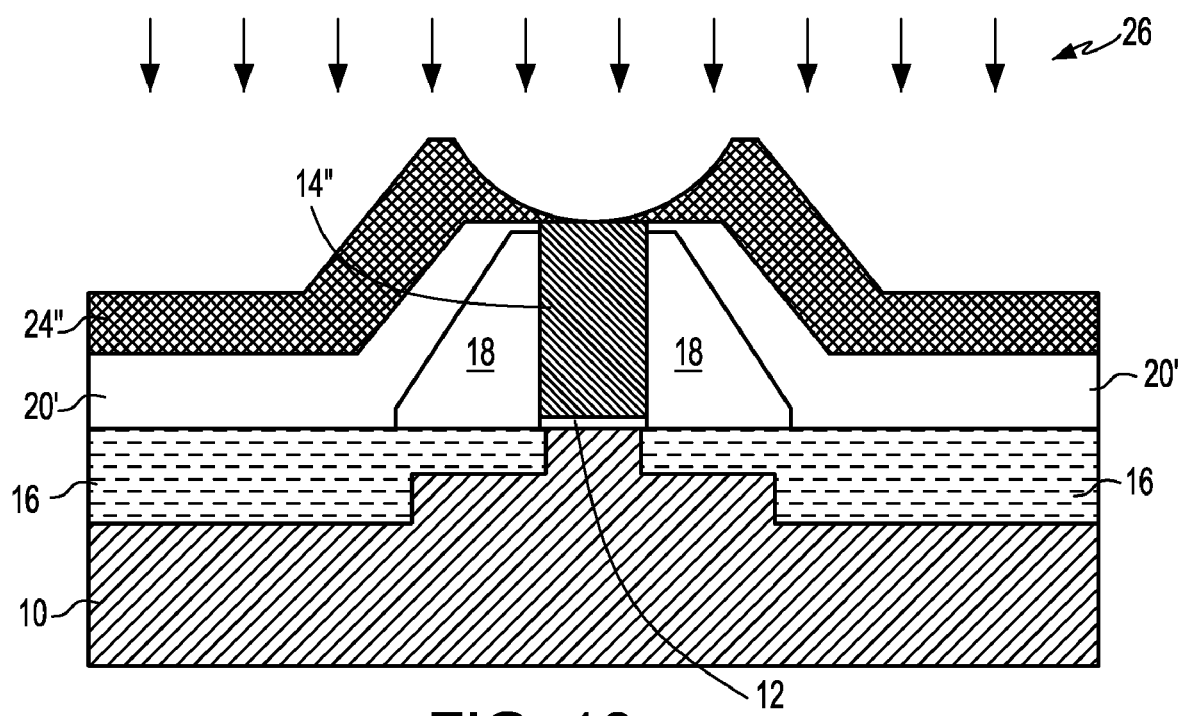

FIG. 10 shows the results of alternative processing of the semiconductor structure of FIG. 8.

FIG. 10 again illustrates the rapid thermal treatment 26 that is used to optically induced thermally anneal the metal silicide forming metal layer 24 contacting the silicon-containing gate 14. However, within FIG. 10 the metal silicide forming metal layer 24 is additionally consumed to form a further consumed metal silicide forming metal layer 24" and the silicon containing gate 14 is further silicided to form the fully silicided gate 14". The above described structure may result from a generally longer exposure to the rapid thermal treatment 26, or from a higher thermal temperature, or from a shorter silicon contained gate height, or from a different material choice.

Within both FIG. 9 and FIG. 10, the patterned capping layer 20' serves as a salicide blocking layer.

Figure 11:
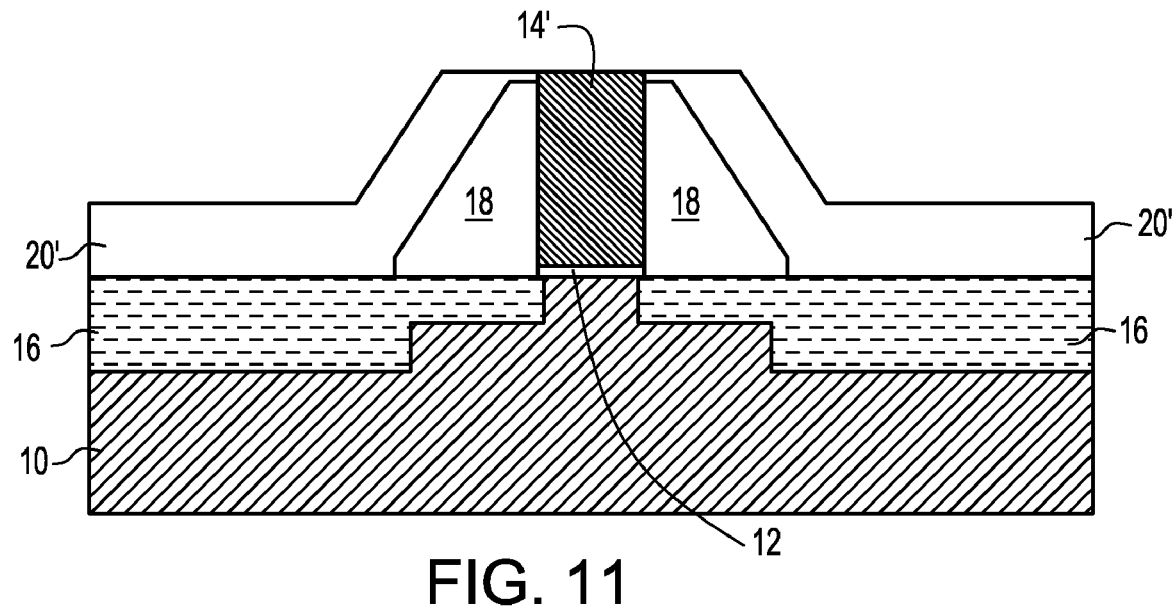

FIG. 11 shows the results of stripping the partially consumed metal silicide forming metal layer 24' from the semiconductor structure whose schematic cross-sectional diagram is illustrated in FIG. 8. A similar semiconductor structure results from stripping the further consumed metal silicide forming metal layer 24" from the semiconductor structure whose schematic cross-sectional diagram is illustrated in FIG. 10, but with the additional exception of substitution of the fully silicided gate 14" for the partially silicided gate 14'. The partially consumed metal silicide forming metal layer 24' or the further consumed metal silicide forming metal layer 24" may be stripped using methods and materials that are appropriate to the metal silicide forming metal from which either of the foregoing metal silicide forming metal layers is comprised. Typical stripping methods include wet chemical stripping methods that use specific acids and acid combinations for stripping specific metal silicide forming metals.

Figure 12:
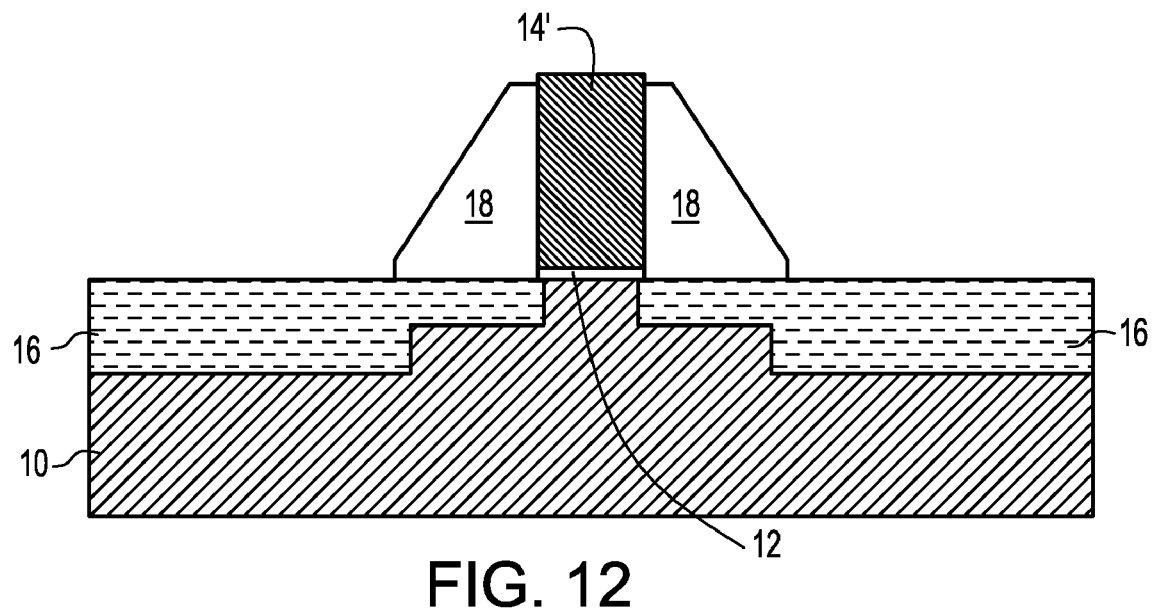

FIG. 12 illustrates the results of stripping the patterned capping layer 20' from the semiconductor structure whose schematic cross-sectional diagram is illustrated in FIG. 1. The patterned capping layer 20' may be stripped using methods and materials that are otherwise generally conventional in the semiconductor fabrication art. When the patterned capping layer 20' comprises a silicon nitride material, the patterned capping layer 20' may be stripped using an aqueous phosphoric acid etchant at an elevated temperature. Alternative methods and materials may also be used.

Figure 13:
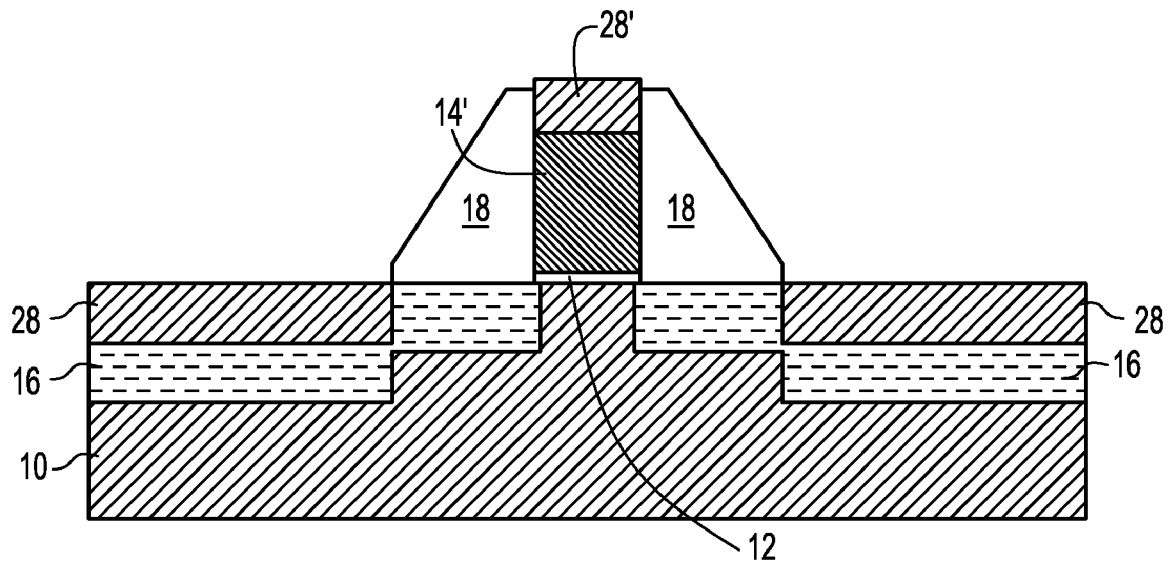

FIG. 13 shows the results of further processing of the semiconductor structure whose schematic cross-sectional diagram is illustrated in FIG. 12. FIG. 13 shows the addition of second silicide layers 28, both of which are located upon the source/drain regions 16, and a third silicide layer 28' which is located upon the partially silicided gate 14'. Together, the partially silicided gate 14' and the second silicide layer 28' comprises a fully silicided gate that differs from the fully silicided gate 14" illustrated within FIG. 10 by the presence of a second silicide material (i.e., second silicide layer) located upon a first silicide material (i.e., partially silicided gate 14') different from the second silicide material. The second silicide layers 28 may comprise a metal silicide forming metal selected from the same group of metal silicide forming metals from which is selected the metal silicide forming metal layer 24 that is illustrated in FIG. 8, as long as the second silicide layers 28 and the metal silicide forming metal layer 24 comprise different metal silicide forming metals.

Figure 14:
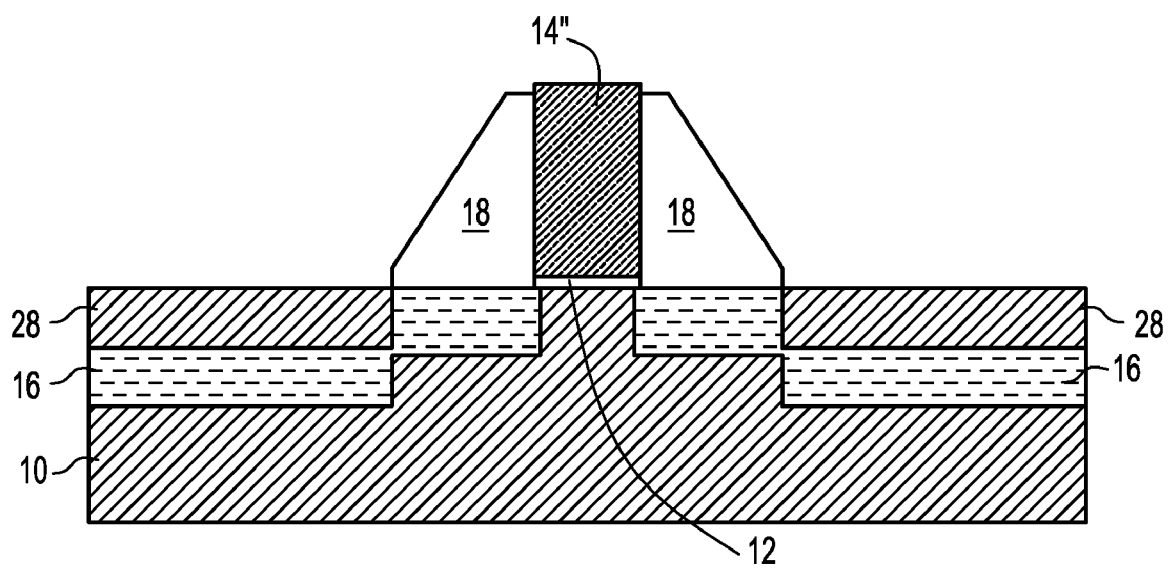

FIG. 14 shows alternative processing of the semiconductor structure whose schematic cross-sectional diagram is illustrated in FIG. 12, under circumstances where the semiconductor structure comprises the fully silicided gate 14" that is illustrated in FIG. 10.

As is illustrated within the schematic cross-sectional diagram of FIG. 14, there is usually no additional second silicide layer 28 located and formed upon the fully silicided gate 14", since the fully silicided gate 14" usually provides no free silicon for reaction with a second metal silicide forming metal layer that is used for forming the second silicide layers 28. In some circumstances, however, a metal silicide forming metal may react with an existing silicide. Thus, the field effect transistor that is illustrated in FIG. 14 commonly comprises a fully silicided gate 14" that comprises a first metal silicide material and a pair of second silicide layers 28 located upon a pair of source/drain regions 16, where the pair of second silicide layers 28 comprise a second metal silicide forming (the composition is different, not necessarily are the materials different) metal different than the first metal silicide forming metal from which is comprised the fully silicided gate 14".

The semiconductor structure whose schematic cross-sectional diagram is illustrated in FIG. 14 provides advantage within the context of field effect transistor fabrication insofar as the semiconductor structure allows for a different silicide material to be used for a fully silicided gate 14" in comparison with a pair of silicide layers 28 located upon a pair of source/drain regions 16. In addition, since the pair of silicide layers 28 is formed after of the fully silicided gate 14", one can optimize the material for gate 14" to achieve desirable work functions and other good properties of gate materials. Also, it is possible to fully silicide a comparatively tall gate without involving an etch back process. And since the pair of silicide layers 28 is formed comparatively late in a processing sequence, they are not impacted by a high temperature anneal applied to gate 14", which avoid to penetrate through and spike into the source/drain regions 16.

The semiconductor structure whose schematic cross-sectional diagram is illustrated in FIG. 13 is desirable within the context of field effect transistor fabrication insofar as the second silicide layer 28 and the partially silicided gate electrode 14' in an aggregate may provide unique physical properties of a fully silicided gate. Such unique physical properties may not otherwise be accessible for a fully silicided gate that comprises only one of a first silicide material from which is comprised the partially silicided gate 14' and a second silicide material from which is comprised the second silicide layer 28. Such a physical property may include, but is not limited to: a work function or an electrical conductivity of the fully silicided gate that comprises the partially silicided gate 14' and the second silicide layer 28.

The preferred embodiments of the invention are illustrative of the invention rather than limiting of the invention. Revisions and modifications may be made to methods, materials, structures and dimensions of a field effect transistor structure in accordance with the preferred embodiments of the invention, while still providing a field effect transistor structure in accordance with the invention, further in accordance with the accompanying claims.

What is claimed is:

1. A method for fabricating a semiconductor structure comprising:

forming a silicon-containing gate on a surface of a gate dielectric which is positioned on a semiconductor substrate and forming a source/drain region into the semiconductor substrate while using the silicon-containing gate as a mask;

masking the source/drain region, without a silicide layer located thereupon, and to avoid spiking of the silicide layer into the source/drain region when partially siliciding the silicon containing gate, with a mask that exposes the silicon-containing gate;

forming a metal silicide forming metal layer contacting the silicon-containing gate;

annealing the metal silicide forming metal layer in contact with the silicon-containing gate to form a partially silicided gate, wherein the annealing has a timescale of about 1 to about 200 milliseconds;

unmasking the source/drain region after forming the partially silicided gate; and forming a second silicide layer upon the partially silicided gate to provide a fully silicided gate and forming a second silicide layer upon the source/drain region, the partially silicided gate comprising a first metal silicide forming metal and the second silicide layer comprising a second metal silicide forming metal different than the first metal silicide forming metal.

2. The method of claim 1 wherein the forming the silicon-containing gate comprises forming the silicon-containing gate comprising a silicon-containing material selected from the group consisting of an amorphous silicon-containing material and a polysilicon-containing material.

3. The method of claim 1 wherein each of the first metal silicide forming metal and the second metal silicide forming metal is selected from the group consisting of cobalt, nickel, platinum, titanium, tungsten, platinum, rhenium and vanadium metal silicide forming metals.

4. The method of claim 1 wherein the forming the fully silicided gate uses a first salicide method followed by a second salicide method.

5. The method of claim 1 wherein the annealing uses a rapid thermal annealing treatment.

6. The method of claim 5 wherein the rapid thermal annealing treatment comprises one of a spike annealing, a flash annealing and a laser annealing treatment.

7. The method of claim 5 wherein the rapid thermal annealing treatment uses a temperature from about 800° to about 1400° C.

* * * * *

UNITED STATES PATENT AND TRADEMARK OFFICE
CERTIFICATE OF CORRECTION

PATENT NO.      : 7,666,790 B2                                      Page 1 of 1
APPLICATION NO. : 11/380528
DATED           : February 23, 2010
INVENTOR(S)     : Luo et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 389 days.

Signed and Sealed this

Seventh Day of December, 2010

David J. Kappos
*Director of the United States Patent and Trademark Office*